(12) United States Patent
Wu et al.

(10) Patent No.: US 6,479,355 B2
(45) Date of Patent: Nov. 12, 2002

(54) METHOD FOR FORMING LANDING PAD

(75) Inventors: King-Lung Wu, Taipei Hsien (TW); Kun-Chi Lin, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 76 days.

(21) Appl. No.: 09/784,235

(22) Filed: Feb. 13, 2001

(65) Prior Publication Data

US 2002/0111006 A1 Aug. 15, 2002

(51) Int. Cl.[7] .............................................. H01L 21/336
(52) U.S. Cl. ....................... 438/279; 438/256; 438/399; 438/586; 438/597
(58) Field of Search .............................. 438/279, 239, 438/256, 399, 586, 587, 597

(56) References Cited

U.S. PATENT DOCUMENTS 6,211,012 B1 * 4/2001 Lee et al. .................... 438/257
6,218,271 B1 * 4/2001 Lee et al. .................... 438/585

* cited by examiner

Primary Examiner—Chandra Chaudhari
Assistant Examiner—Jack Chen
(74) Attorney, Agent, or Firm—J.C. Patents

(57) ABSTRACT

The present invention provides a method for landing pads in the semiconductor devices, comprising the following steps: providing a semiconductor substrates with a plurality of active regions, a plurality of gate structures above the active regions and a plurality of source/drain regions, while each gate structure comprises a top cap layer and sidewall spacers; forming a conductive layer over the substrate; removing a portion of the conductive layer above the gate structure using the top cap layer of the gate structure as a stop layer, so that a height of the conductive layer is lower than a height of the gate structure; forming a patterned mask layer, right above the active regions, over the substrate; performing an etching step to define the conductive layer above the active regions; and removing the patterned mask layer and forming landing pads on the active regions.

14 Claims, 6 Drawing Sheets

METHOD FOR FORMING LANDING PAD

BACKGROUND OF THE INVENTION

1. Field of Invention

The present invention relates to a method for manufacturing semiconductor devices. More particularly, the present invention relates to a method for forming landing pads in semiconductor devices.

2. Description of Related Art

As integrity of the integrated circuits increases, less and less area can be used to manufacture interconnects. For very large scale integration (VLSI) ICs, a multilevel interconnect structure, including two or more levels of metal-interconnect structures that serve as wiring line structures for electrically interconnecting the various components in the integrated circuits, are typically formed.

However, the multilevel interconnect structure increases aspect ratios for contact openings due to the increased height in the semiconductor devices. Because of the increased aspect ratios, the alignment window and the etching window for the contact opening become smaller. For overcoming this problem, a self-aligned contact process has been developed. The self-aligned contact (SAC) process has been widely used in manufacturing the landing pad in the dynamic random access memory (DRAM) device.

FIG. 1A to FIG. 1D are cross-sectional views illustrating the process steps of manufacturing the prior art landing pad in the DRAM device.

Referring to FIG. 1A, a semiconductor substrate 100 is provided with shallow trench isolation (STI) structures 110, gate structures 127, a common source region 130 and drain regions 132 formed therein. The gate structure 127 includes a gate oxide layer 122, a polysilicon layer (wordline) 120, a nitride cap layer 124 and nitride spacers 126.

Referring to FIG. 1B, a first dielectric layer 140 is deposited over the substrate 100. For example, the first dielectric layer 140 is a silicon oxide layer formed by chemical vapor deposition (CVD). A patterned photoresist layer 145 is formed on the first dielectric layer 140. Using the patterned photoresist layer 145 as an etching mask, an anisotropic etching step, such as a dry etching step, is performed to remove a portion of the first dielectric layer 140 until the substrate is exposed. Next, the patterned photoresist layer 145 is removed, and self-aligned contact openings 148 are formed.

Referring to FIG. 1C, a polysilicon layer 150 is deposited over the substrate 100 and fills the self-aligned contact openings 148. Using the first dielectric layer 140 as a polishing stop layer, a chemical mechanical polishing (CMP) step is performed to remove a portion of the polysilicon layer 150 above the first dielectric layer 140, so that landing pads 150 are formed inside the self-aligned contact opening 148.

Referring to FIG. 1D, after forming the landing pads 150, a second dielectric layer 160 is formed over the substrate 100. After a bitline opening 170 is formed in the second dielectric layer 160 above the common source region 130, a conductive material is filled in the bitline opening 170 to form a bitline 175. Afterwards, a third dielectric layer 180 is formed to cover the second dielectric layer 170 and the bitline 175. After node contact openings 185 are formed through the third dielectric layer 180 and the second dielectric layer 170 above the drain regions 132, a conductive material is filled into the node contact openings 185 to form lower electrodes (not shown) for the DRAM cell.

As cited above, the SAC process is used to form the self-aligned contact opening. Even though the SAC opening can increase the etching window and the alignment window for forming the bitline opening and the node contact opening in the following processes, the SAC process, including depositing, photolithography and etching, also complicate the whole processes.

SUMMARY OF THE INVENTION

The invention provides a method for forming landing pads in the semiconductor devices. The present invention can reduce steps of the SAC process, thus increasing stability of the semiconductor devices and reducing costs.

As embodied and broadly described herein, the invention provides a method for landing pads in the semiconductor devices, comprising the following steps: providing a semiconductor substrates with a plurality of active regions, a plurality of gate structures above the active regions and a plurality of source/drain regions, while each gate structure comprises a top cap layer and sidewall spacers; forming a conductive layer over the substrate; removing a portion of the conductive layer above the gate structure using the top cap layer of the gate structure as a stop layer, so that a height of the conductive layer is lower than a height of the gate structure; forming a patterned mask layer, right above the active regions, over the substrate; performing an etching step to define the conductive layer above the active regions; and removing the patterned mask layer and forming landing pads on the active regions.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIG. 2A to FIG. 2D are cross-sectional views illustrating the process steps of manufacturing a landing pad in a DRAM device according to one preferred embodiment of this invention.

Figure 1A:
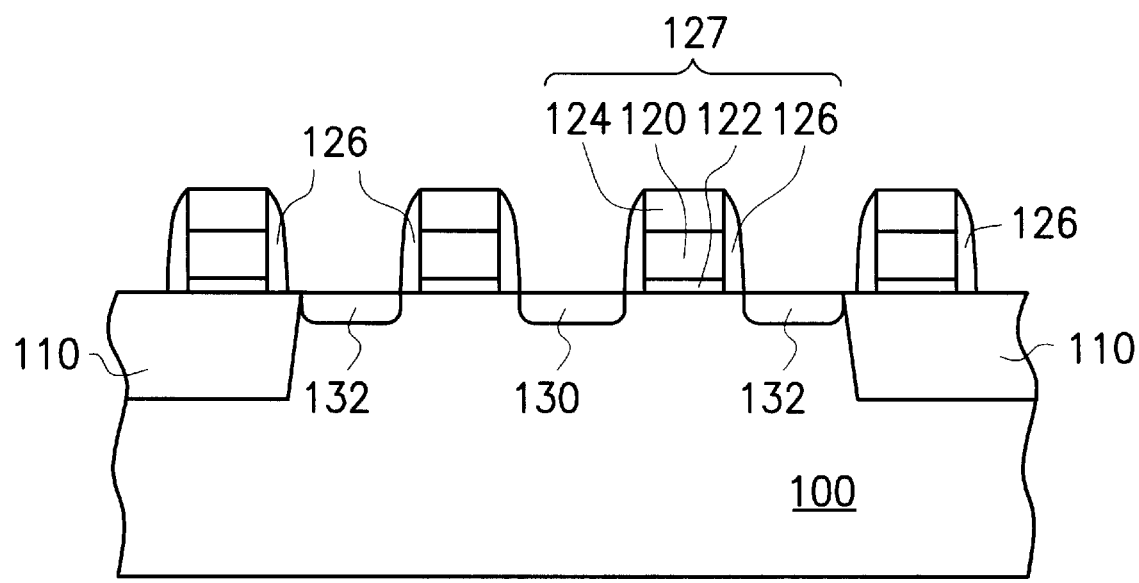
FIG. 1A to FIG. 1D are cross-sectional views illustrating the process steps of manufacturing the prior art landing pad in the DRAM device.
Figure 1B:
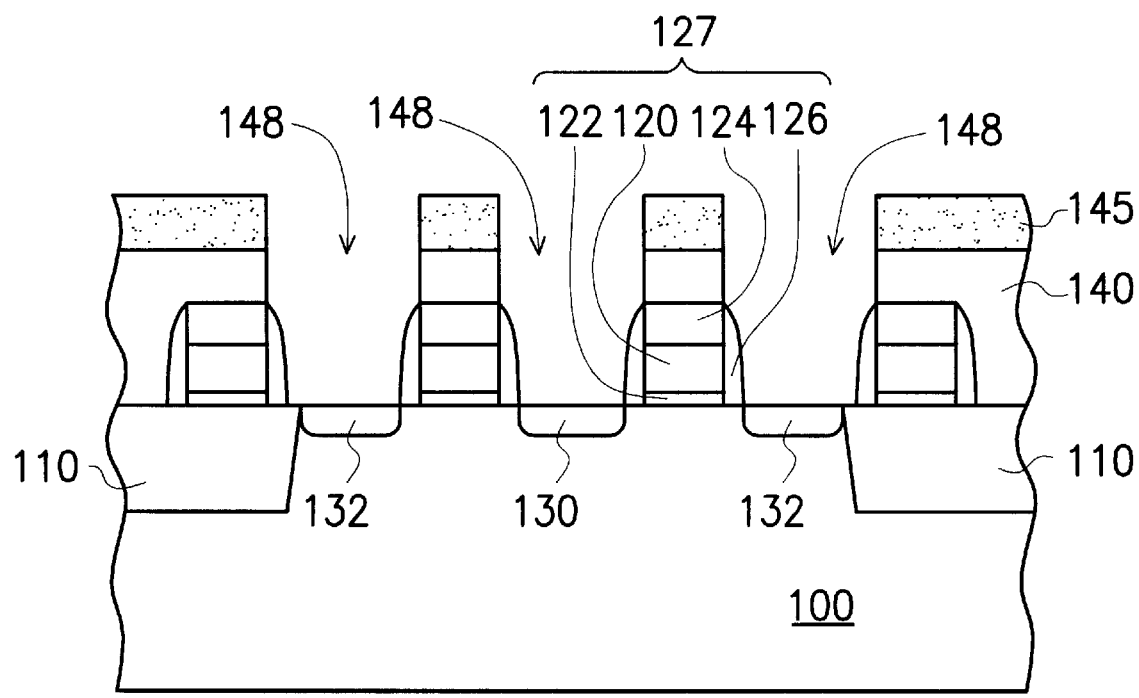
Figure 1C:
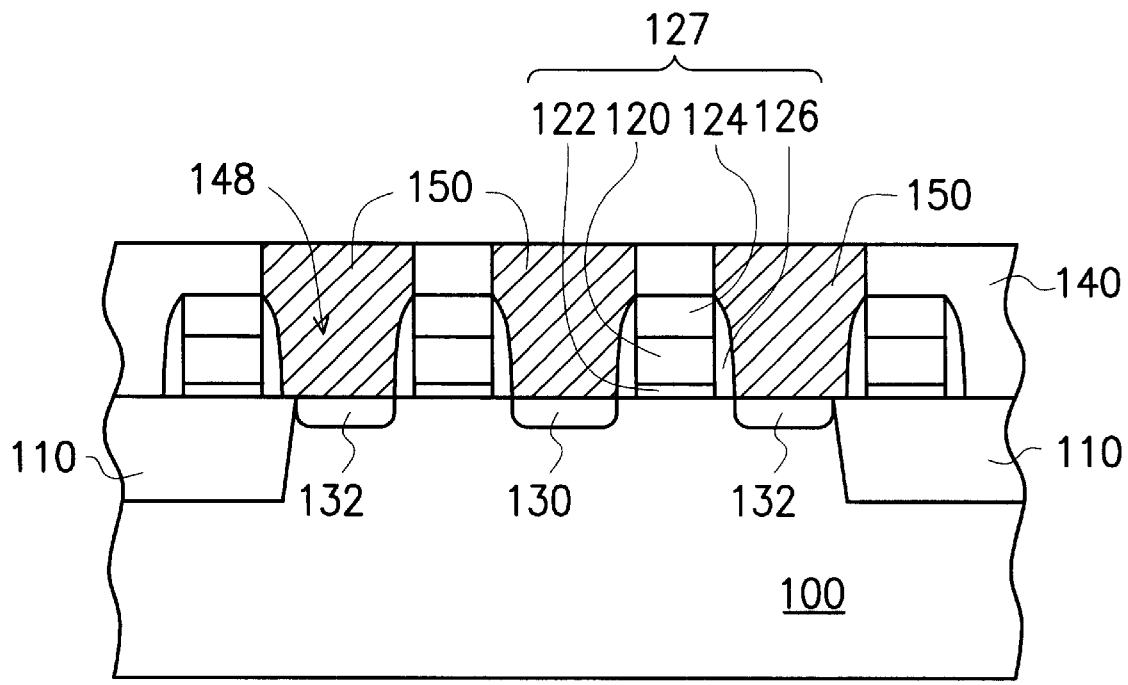
Figure 1D:
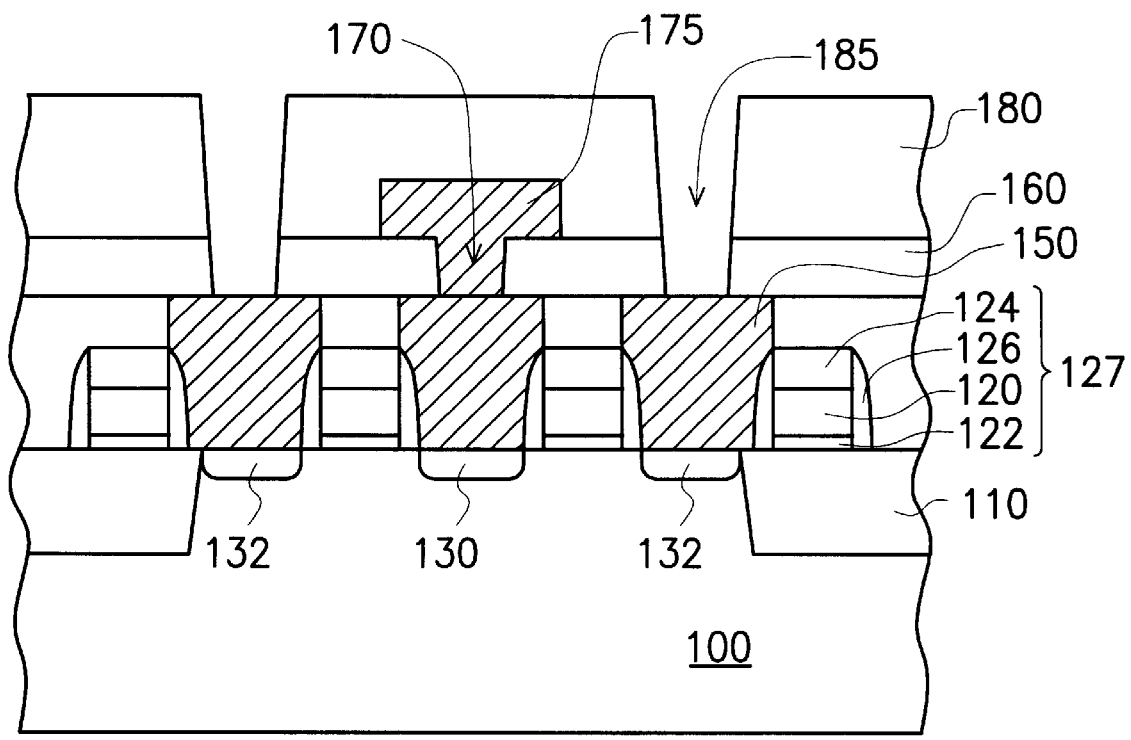
Figure 2A:
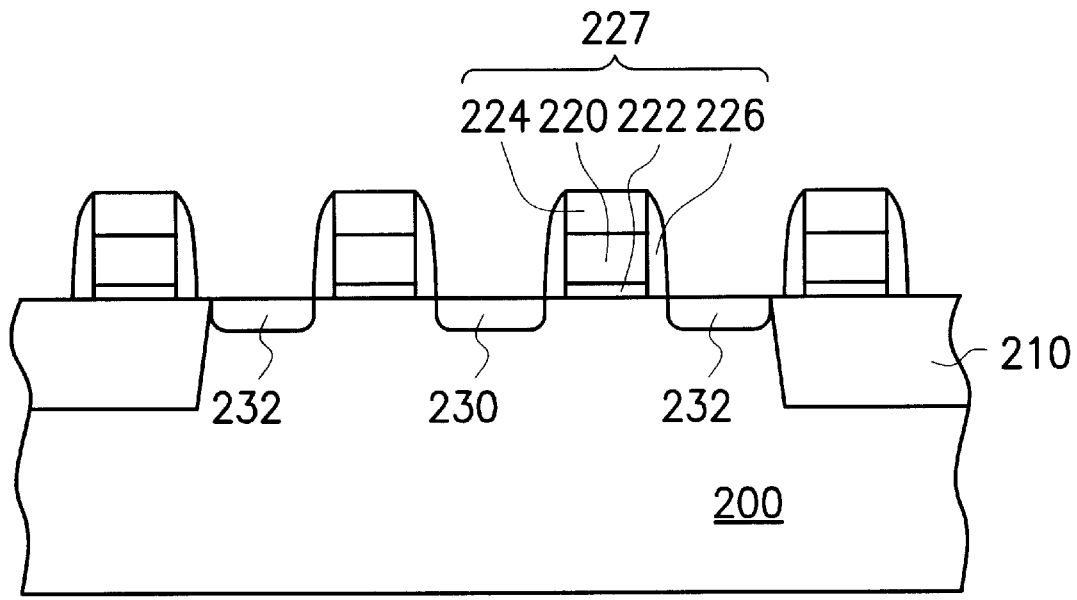
FIG. 2A to FIG. 2D are cross-sectional views illustrating the process steps of manufacturing a landing pad in a DRAM device according to one preferred embodiment of this invention.
Figure 3A:
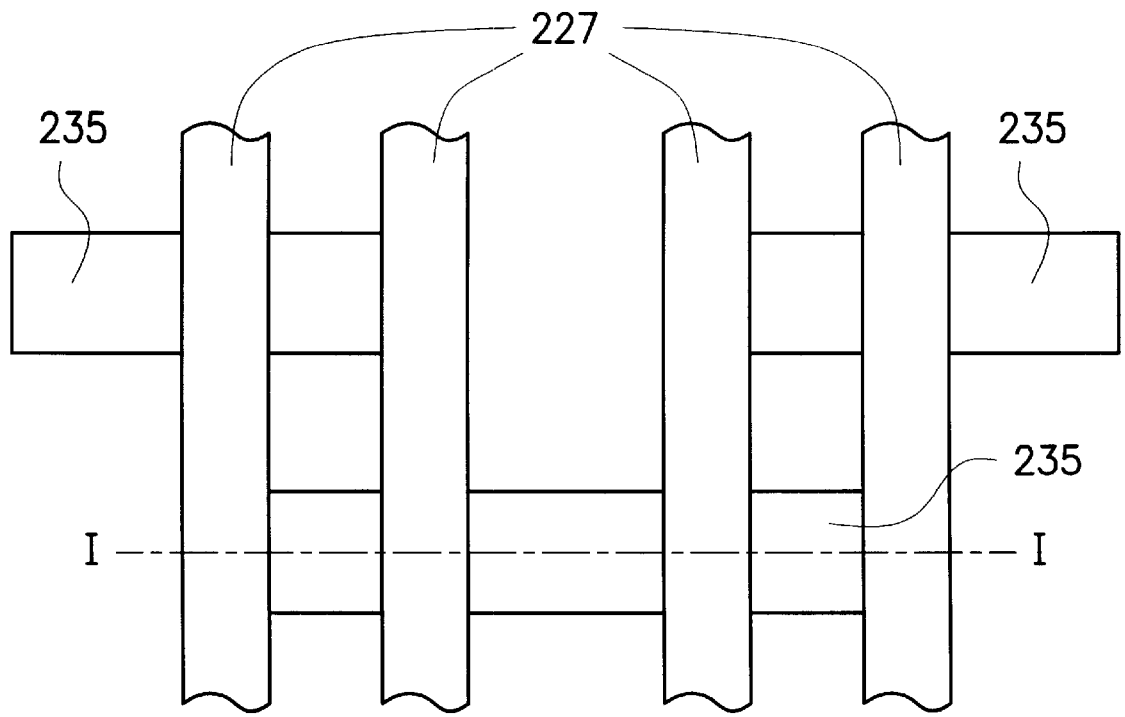
FIG. 3A to FIG. 3C are top views of FIG. 2A to FIG. 2C respectively according to one preferred embodiment of this invention.

Referring to FIG. 2A, a semiconductor substrate 200 is provided with at least shallow trench isolation structures 210, gate structures 227, a common source region 230 and drain regions 232 formed therein. The gate structure 227 includes a gate oxide layer 222, a polysilicon layer (wordline) 220, a cap layer 224 and spacers 226. For example, the cap layer 224 and spacers 226 are silicon nitride layers formed by chemical vapor deposition (CVD). Referring to FIG. 3A, a top view of FIG. 2A, the gate structures 227 overly active regions 235, so that the active regions underlying forms the common source region 230 and the drain regions 232. FIG. 2A is depicted according to the cross-sectional line I—I.

Figure 2B:
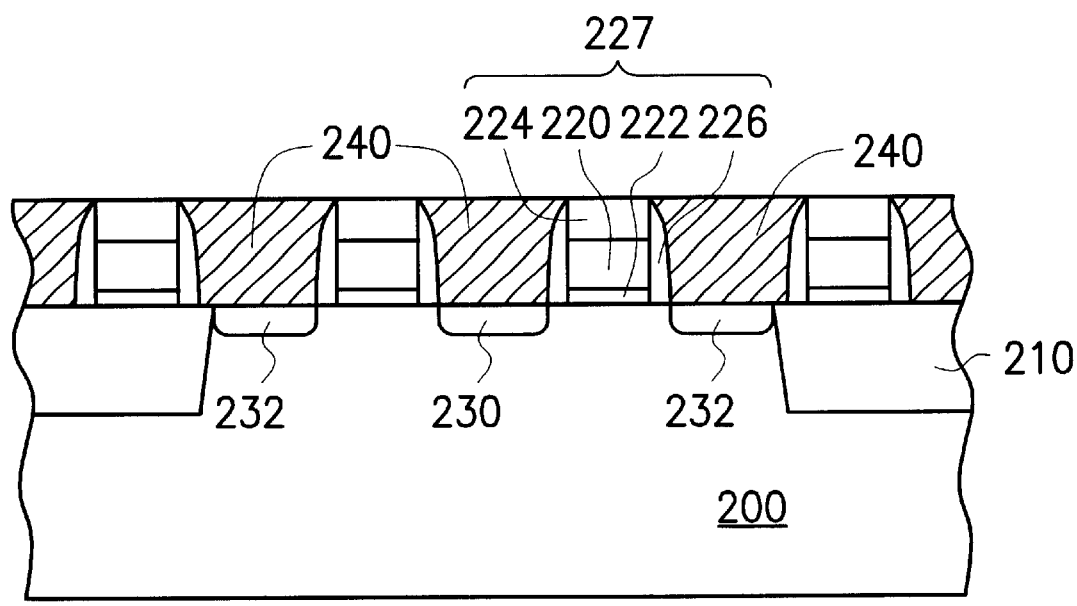
Figure 3B:
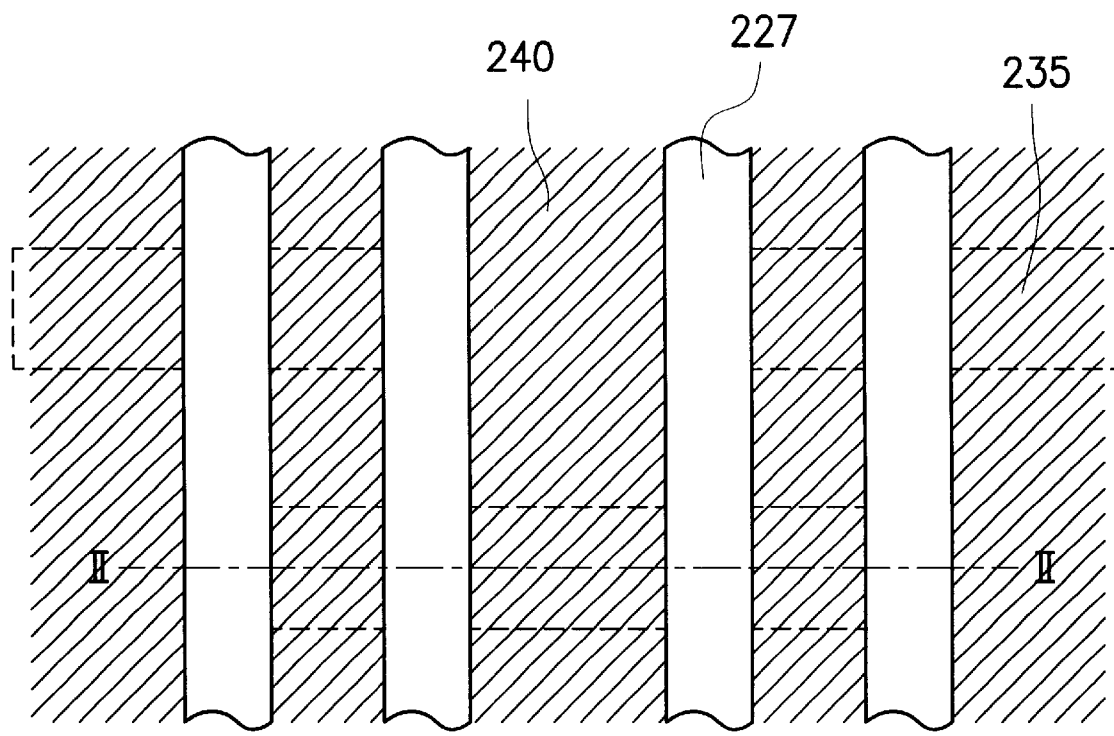

Referring to FIG. 2B, a conductive layer 240, such as a polysilicon layer, is formed over the substrate 100. Using the cap layer 224 as a stop layer, a portion of the conductive layer 240 above the cap layer 224 is removed by, for example, chemical mechanical polishing (CMP) or etching back. A height of the conductive layer 240 is lower than a height of the gate structure 227, so that the conductive layer between the gate structures is disconnected to prevent shorts. Preferably, an etching selectivity between the conductive layer 240 and the cap layer 224 is larger than 1.0, so that the gate structures 227 (including a wordline 220) will not be damaged. Referring to FIG. 3B, a top view of FIG. 2B, the conductive layer 240 fills in gaps between the gate structures 227. FIG. 2B is depicted according to the cross-sectional line II—II.

Figure 2C:
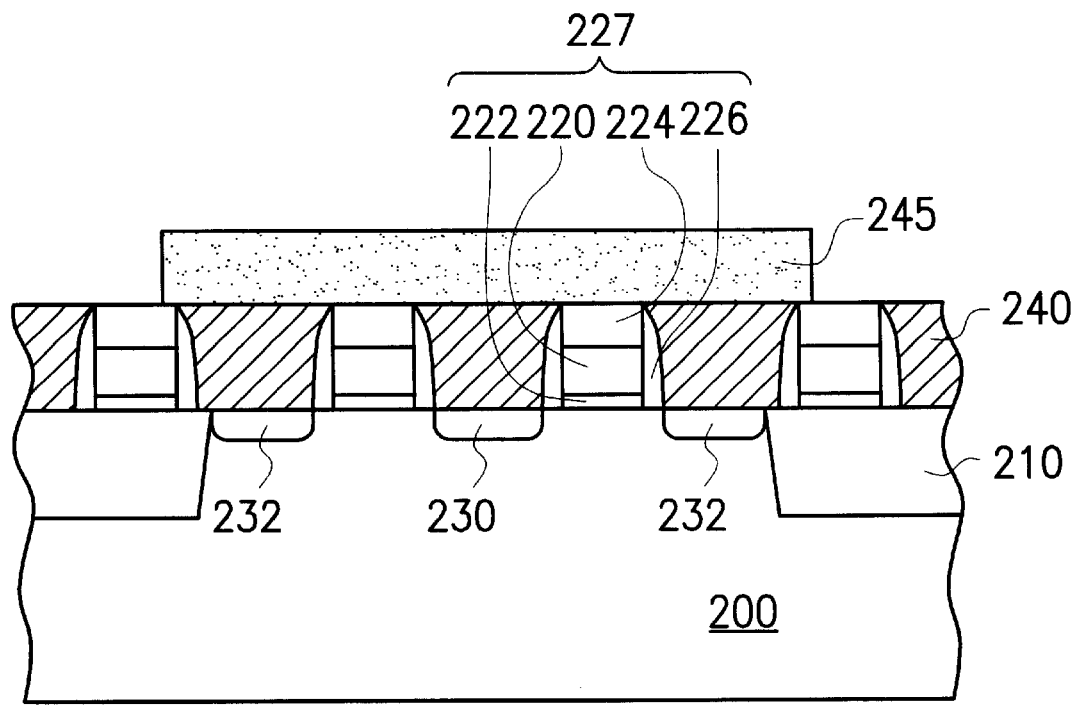
Figure 3C:
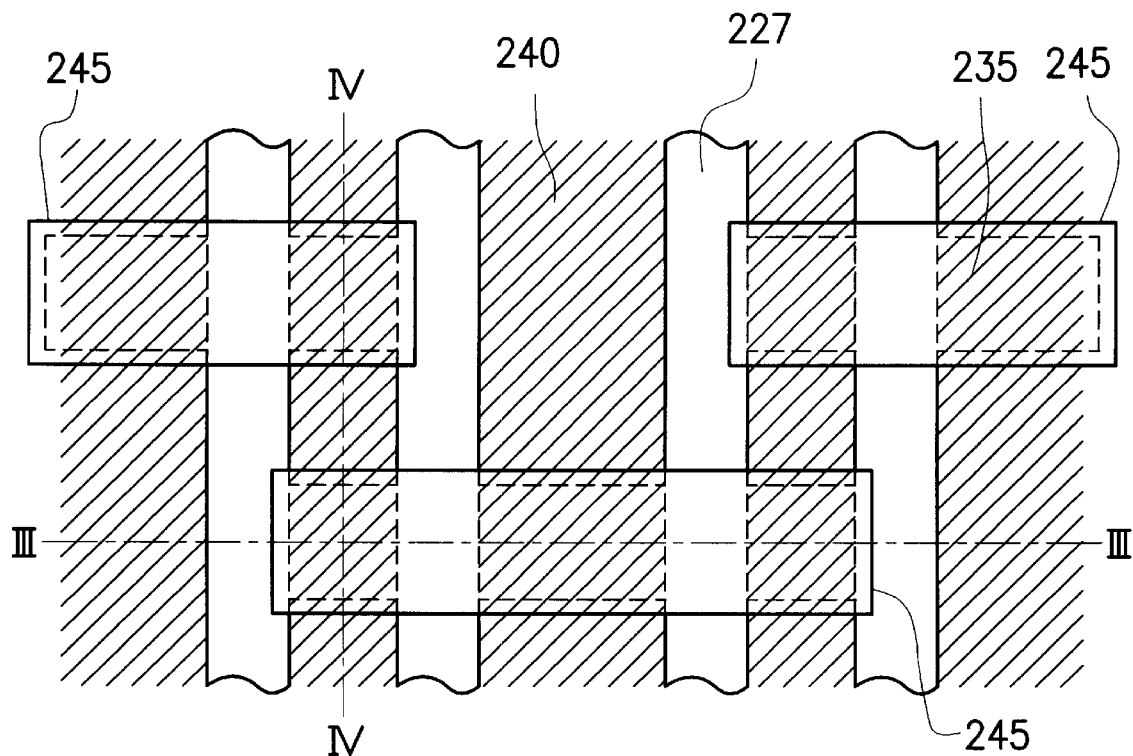

Referring to FIGS. 2C and 3C, FIG. 2C is depicted according to the cross-sectional line III—III. A patterned mask layer 245, such as a photoresist layer or a silicon nitride layer, is formed on the conductive layer 240 and the gate structures 227. Using the patterned mask layer 245 as an etching mask, an anisotropic etching step, such as a dry etching step, is performed to define the conductive layer 240 above the active region 235. Preferably, an etching selectivity between the conductive layer 240 and the cap layer 224 is larger than 1.0 to prevent the wordline 220 in the gate structure 227 being damaged.

Figure 4:
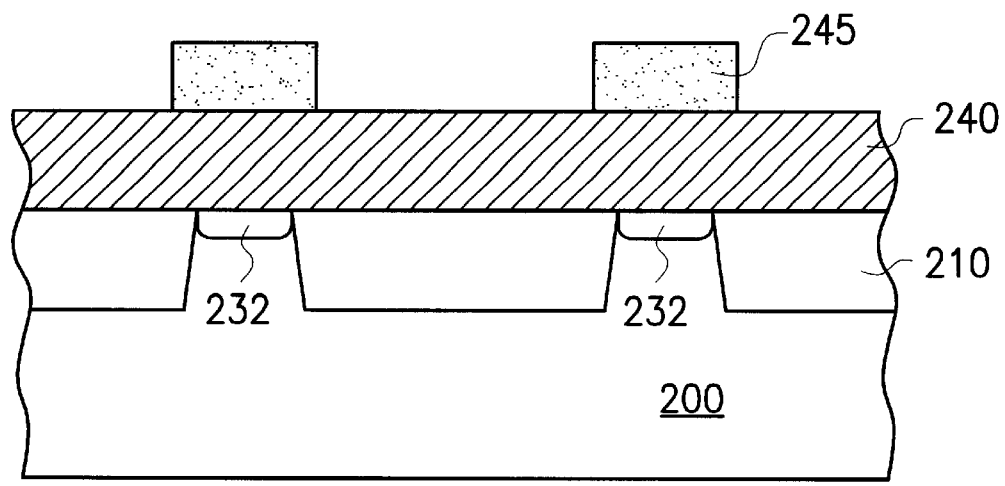
FIG. 4 is a cross-sectional view of FIG. 3C according to the line IV—IV.

In order to clarify how the patterned mask layer 245 is formed, please refer to FIGS. 3C, 2C and FIG. 4. FIG. 4 is a cross-sectional view depicted from the line IV—IV of FIG. 3C. The patterned mask layer 245 overlies right above the active regions 235, with an area a little bit larger than an area of the active region 235, so that the conductive layer 240 between the mask layer 245 and the active region 235 is protected.

Figure 2D:
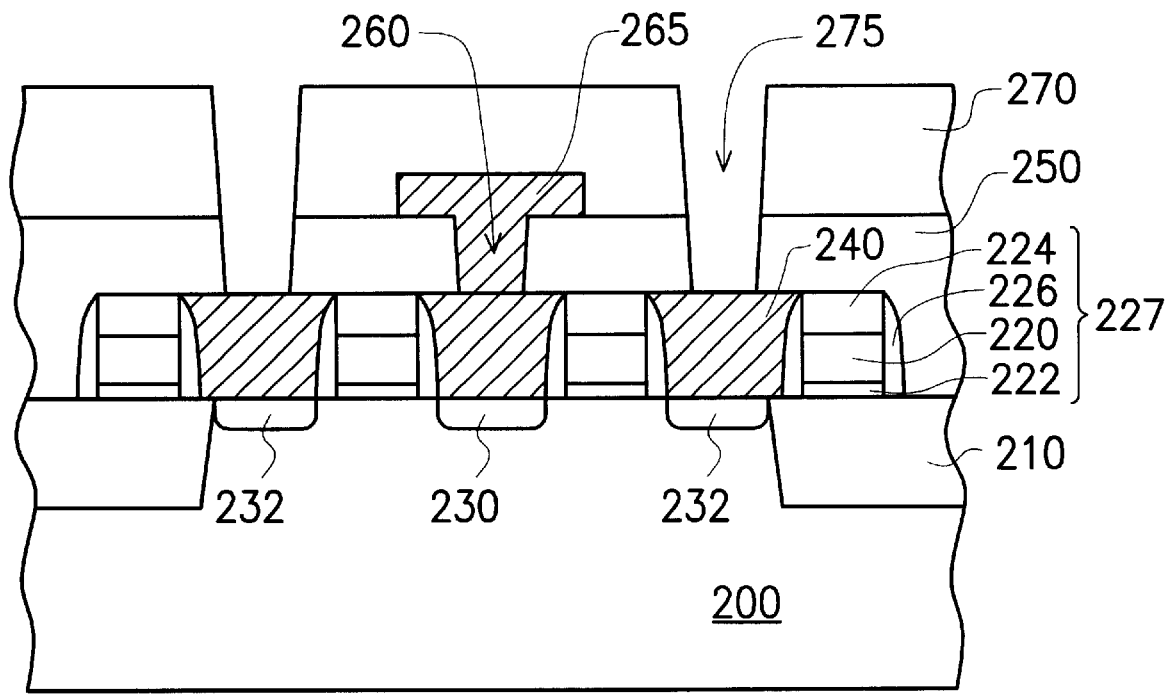

Referring to FIG. 2D, the mask layer 245 above the active region 235 is removed and landing pads 240 are formed on the common source region 230 and the drain region 232 in the active region 235.

After forming the landing pads 240, a first dielectric layer 250 is formed over the substrate 100. After a bitline opening 260 is formed in the first dielectric layer 250 above the common source region 230, a conductive material is filled in the bitline opening 260 to form a bitline 265. Afterwards, a second dielectric layer 270 is formed to cover the first dielectric layer 250 and the bitline 265. After node contact openings 275 are formed through the second dielectric layer 270 and the first dielectric layer 250 above the drain region 232, a conductive material is filled into the node contact openings 275 to form lower electrodes (not shown) for the DRAM cell.

The feature of the present invention is to form a conductive layer over the substrate before the SAC process. The conductive layer fills up gaps between the gate structures. After CMP is performed to remove the conductive layer above the gate structures, a patterned photoresist layer is used to define the conductive layer right above the active regions in order to form the landing pads. Therefore, the landing pads are formed without using the SAC process, thus reducing complexity of the manufacture process. Furthermore, compared with the prior methods, the etching window and the alignment window for forming the landing pads of this invention remains the same, thus increasing stability of devices and saving costs.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a landing pad in a semiconductor device, comprising:

providing a semiconductor substrate, wherein the substrate includes a plurality of active regions, a plurality of gate structures above the active regions and a plurality of source/drain regions, and wherein each gate structure comprises a top cap layer and sidewall spacers;

forming a conductive layer over the substrate;

removing a portion of the conductive layer above the gate structure using the top cap layer of the gate structure as a stop layer, so that a height of the conductive layer is lower than a height of the gate structure;

forming a patterned mask layer, right above the active regions, over the substrate;

performing an etching step to define the conductive layer above the active regions; and removing the patterned mask layer and forming landing pads on the active regions.

2. The method as claimed in claim 1, wherein in the step of removing a portion of the conductive layer above the gate structure using the top cap layer of the gate structure as the stop layer, an etching selectivity between the conductive layer and the stop layer is larger than 1.0.

3. The method as claimed in claim 1, wherein in the step of performing an etching step to define the conductive layer above the active regions, an etching selectivity between the conductive layer and the top cap layer is larger than 1.0.

4. The method as claimed in claim 1, wherein a material of the top cap layer comprises silicon nitride.

5. The method as claimed in claim 1, wherein a material of the spacers comprises silicon nitride.

6. The method as claimed in claim 1, wherein a material of the conductive layer comprises polysilicon.

7. The method as claimed in claim 1, wherein the step of removing a portion of the conductive layer above the gate structure comprises performing a chemical mechanical polishing step.

8. The method as claimed in claim 1, wherein the step of removing a portion of the conductive layer above the gate structure comprises performing an etching back step.

9. The method as claimed in claim 1, wherein the patterned mask layer comprises a photoresist layer.

10. The method as claimed in claim 1, wherein the patterned mask layer comprises a silicon nitride layer.

11. The method as claimed in claim 1, wherein the step of performing an etching step to define the conductive layer above the active regions comprises performing an anisotropic etching step.

12. The method as claimed in claim 11, wherein the anisotropic etching step is a dry etching step.

13. A method for forming a landing pad in a DRAM device, comprising:

provide a semiconductor substrate with a plurality of field transistors, wherein the field transistors comprise a plurality of wordlines, a plurality of common source regions and a plurality of drain regions, and wherein each wordline comprises a top nitride cap layer and sidewall nitride spacers;

depositing a polysilicon layer over the substrate;

removing a portion of the polysilicon layer above the wordline using the top nitride cap layer of the wordline as a stop layer, so that a height of the polysilicon layer is lower than a height of the wordline;

forming a patterned photoresist layer above the field transistors;

performing an anisotropic etching step to define the polysilicon layer above the field transistors; and removing the patterned photoresist layer and forming landing pads on the source/drain regions.

14. The method as claimed in claim 13, wherein the anisotropic etching step comprises a dry etching step.

* * * * *